United States Patent [19]

Rose et al.

[11] Patent Number: 4,600,971
[45] Date of Patent: Jul. 15, 1986

[54] LEAD FRAMES WITH DIELECTRIC HOUSINGS MOLDED THEREON

[75] Inventors: William H. Rose; David T. Shaffer, both of Harrisburg, Pa.

[73] Assignee: AMP Incorporated, Harrisburg, Pa.

[21] Appl. No.: 609,165

[22] Filed: May 11, 1984

[51] Int. Cl.[4] ............................................. H05K 5/02
[52] U.S. Cl. .................... 361/421; 206/330; 357/70; 357/75
[58] Field of Search ............... 174/52 FP; 357/68, 70, 357/74, 75; 361/395, 398, 407, 421, 414, 401, 403; 206/328, 329, 330

[56] References Cited

U.S. PATENT DOCUMENTS

| | | | |
|---|---|---|---|
| 2,869,040 | 1/1959 | Pifer | 361/414 |
| 3,072,734 | 1/1963 | Fox et al. | 361/421 |
| 3,469,953 | 9/1969 | St. Clair et al. | 361/398 |
| 3,837,001 | 9/1974 | Hughes et al. | 357/70 |
| 3,978,375 | 8/1976 | Fukui et al. | 361/421 |
| 4,054,238 | 10/1977 | Lloyd et al. | 174/52 FP |
| 4,168,404 | 9/1979 | Lockard | 361/421 |

Primary Examiner—Roy N. Envall, Jr.
Assistant Examiner—Gregory D. Thompson
Attorney, Agent, or Firm—Adrian J. LaRue; Anton P. Ness

[57] ABSTRACT

Electrical lead frames are stamped from a strip of metal, each of the lead frames including spaced metal strips extending between carrier members. Projections extend outwardly from the metal strips. A dielectric housing is molded onto each of the lead frames and includes recesses in one surface exposing respective projections and holes extending through the housing in communication with the respective projections so that the electrical leads of electronic components and electrical wires can be inserted into the holes in electrical engagement with the projections and secured therein by the projections.

7 Claims, 8 Drawing Figures

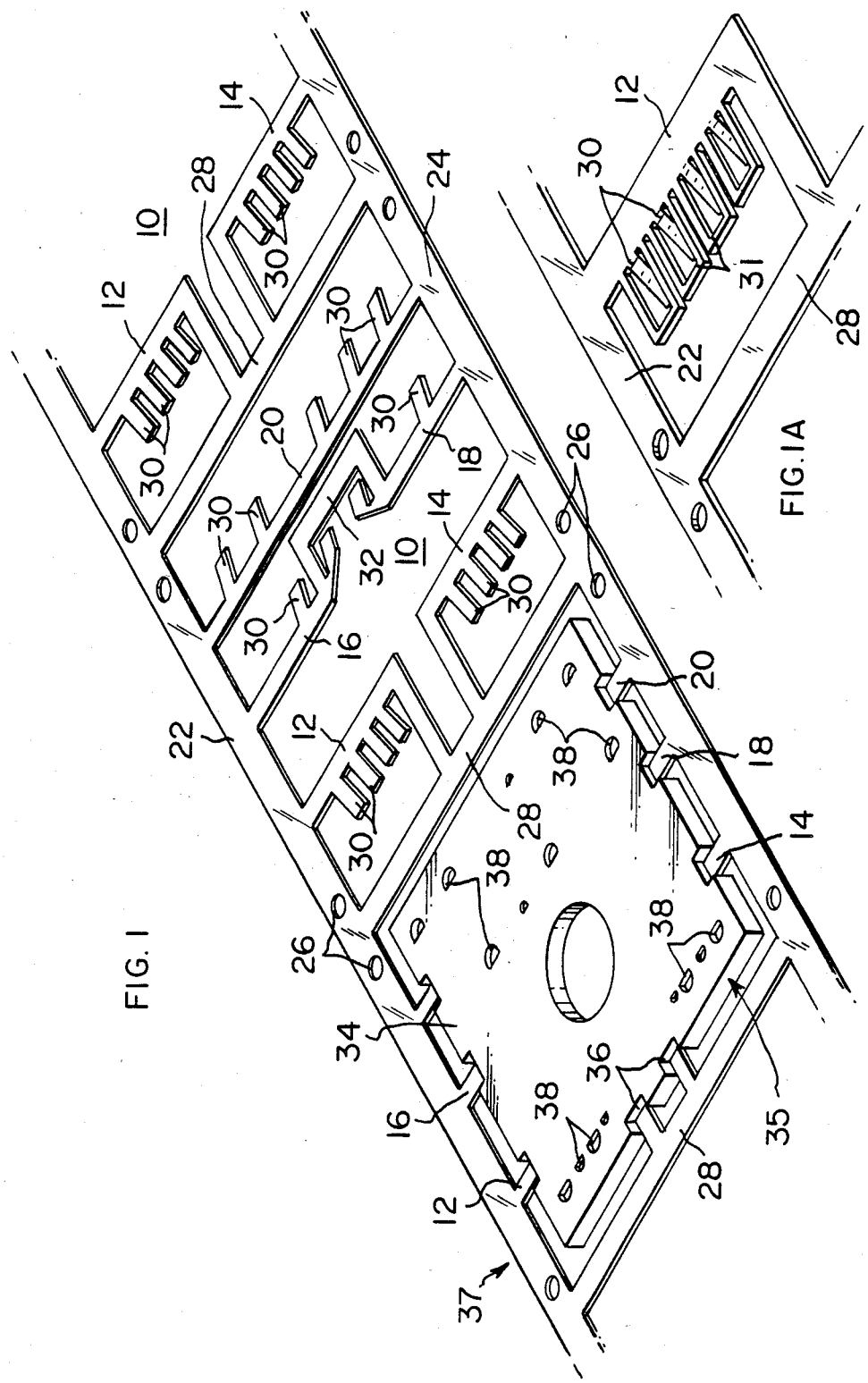

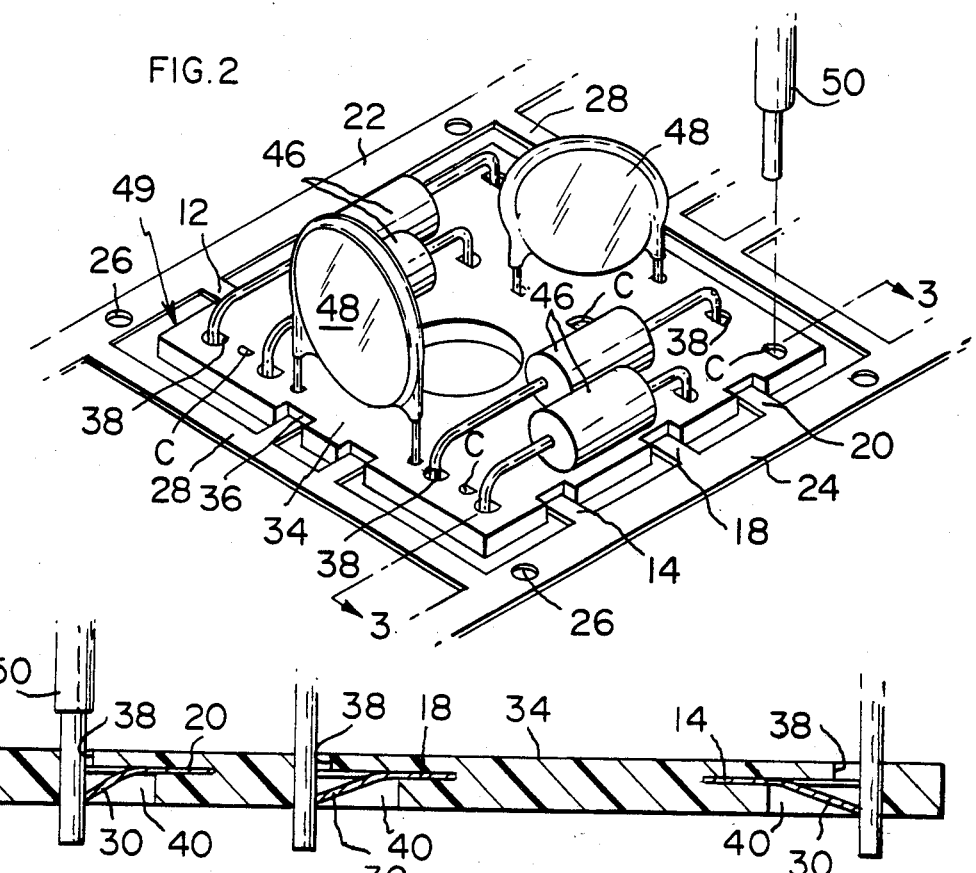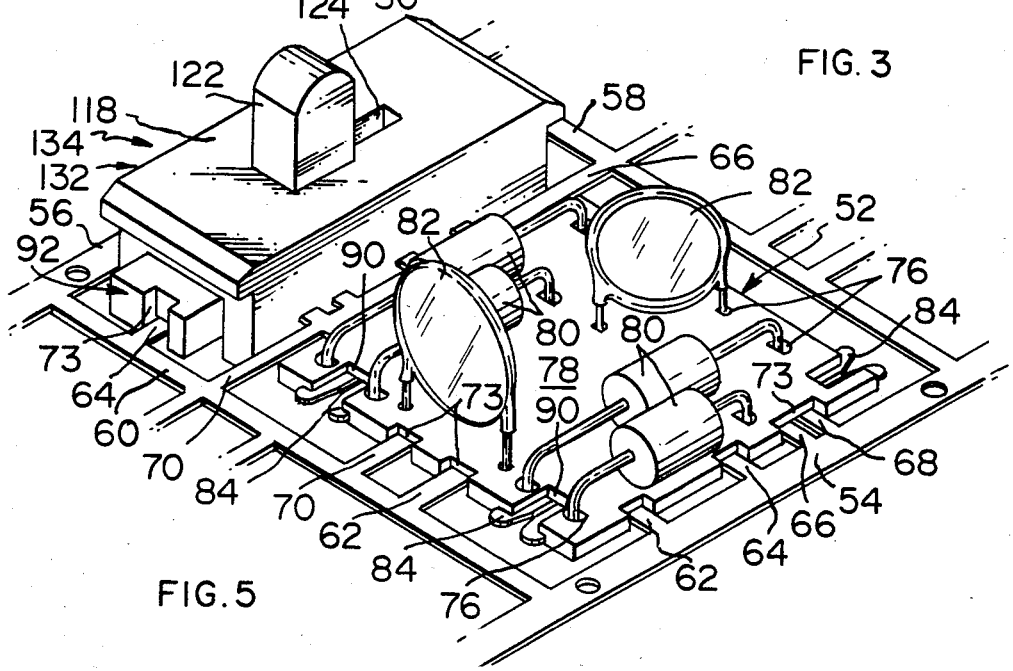

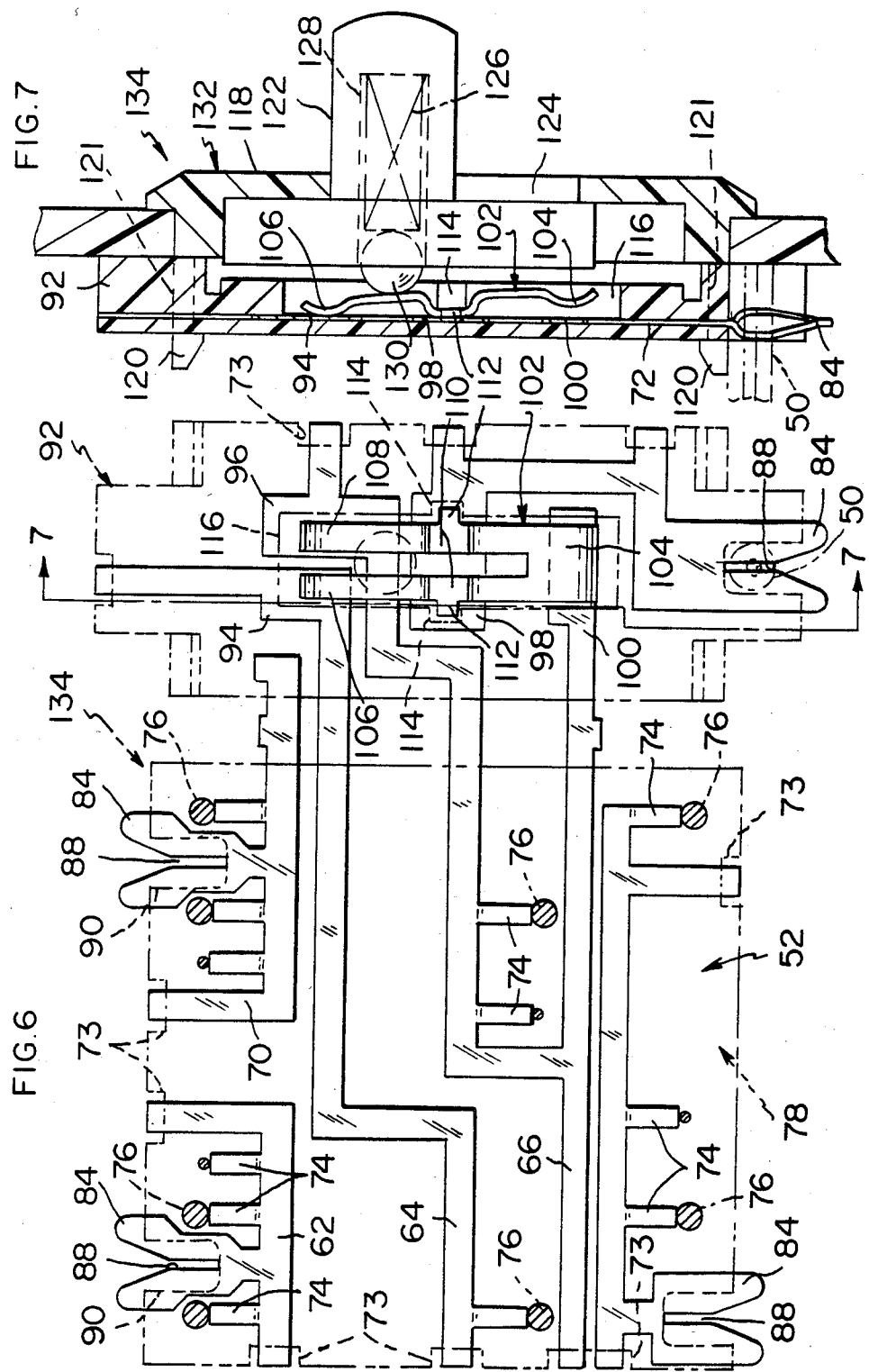

LEAD FRAMES WITH DIELECTRIC HOUSINGS MOLDED THEREON

FIELD OF THE INVENTION

This invention relates to electrical lead frames and more particularly to electrical lead frames encased in dielectric housings thereby forming insulated lead frames in which electrical components can be electrically and mechaically connected to form electrical circuits.

BACKGROUND OF THE INVENTION

Printed circuit boards are used to form electronic circuits. An example of this is that when AC voltage is used to operate the DC motor, a full wave diode rectifier bridge is required to translate the AC voltage to DC voltage. The bridge that is currently used has diodes and capacitors manually assembled into holes in a printed circuit board whereafter the components are wave soldered in place.

This arrangement is costly as a result of manufacturing or procuring the PCB, manually inserting the components in the board, soldering them in place, and then hand soldering the power leads to the board during the assembly of the device in which the DC motor is to be used.

SUMMARY OF THE INVENTION

According to the present invention, electrical lead frames are stamped from a strip of metal, each of the lead frames including spaced metal strips extending between carrier strips. Projections extend outwardly from the metal strips. A dielectric housing is molded onto each of the lead frames and includes recesses in one surface exposing respective projections and holes extending through the housing in communication with the respective projections so that the electrical leads of electronic components and electrical wires can be inserted into the holes in electrical engagement with the projections and secured therein by the projections.

After the dielectric housings have been molded onto the lead frames forming a continuous lead frame assembly, it can be reeled onto a reel. The lead frame assembly can be unreeled into a component insertion machine in which components are inserted into the holes in the housings and electrically and mechanically secured therein thereby forming electronic circuit packages. These electronic circuit packages can then be severed from the carrier strips for use in electrical devices.

BRIEF DESCRIPTION OF THE DRAWINGS

FIG. 1 is a perspective view of lead frames secured to carrier strips with a dielectric housing molded onto one of the lead frames forming an insulated lead frame.

FIG. 1A is a part perspective view showing an alternative embodiment of the conductor-securing members.

FIG. 2 is a view similar to FIG. 1 showing electronic components secured in holes in the housing forming an electronic package.

FIG. 3 is a cross-sectional view taken along line 3—3 of FIG. 2.

FIG. 5 is a perspective view of an alternative embodiment of an electronic package.

FIG. 6 is a top plan view of FIG. 5 showing the lead frame and switch member of the electronic package of FIG. 5.

FIG. 7 is a cross-sectional view taken along line 7—7 of FIG. 6.

DETAILED DESCRIPTION OF THE INVENTION

Figure 4:
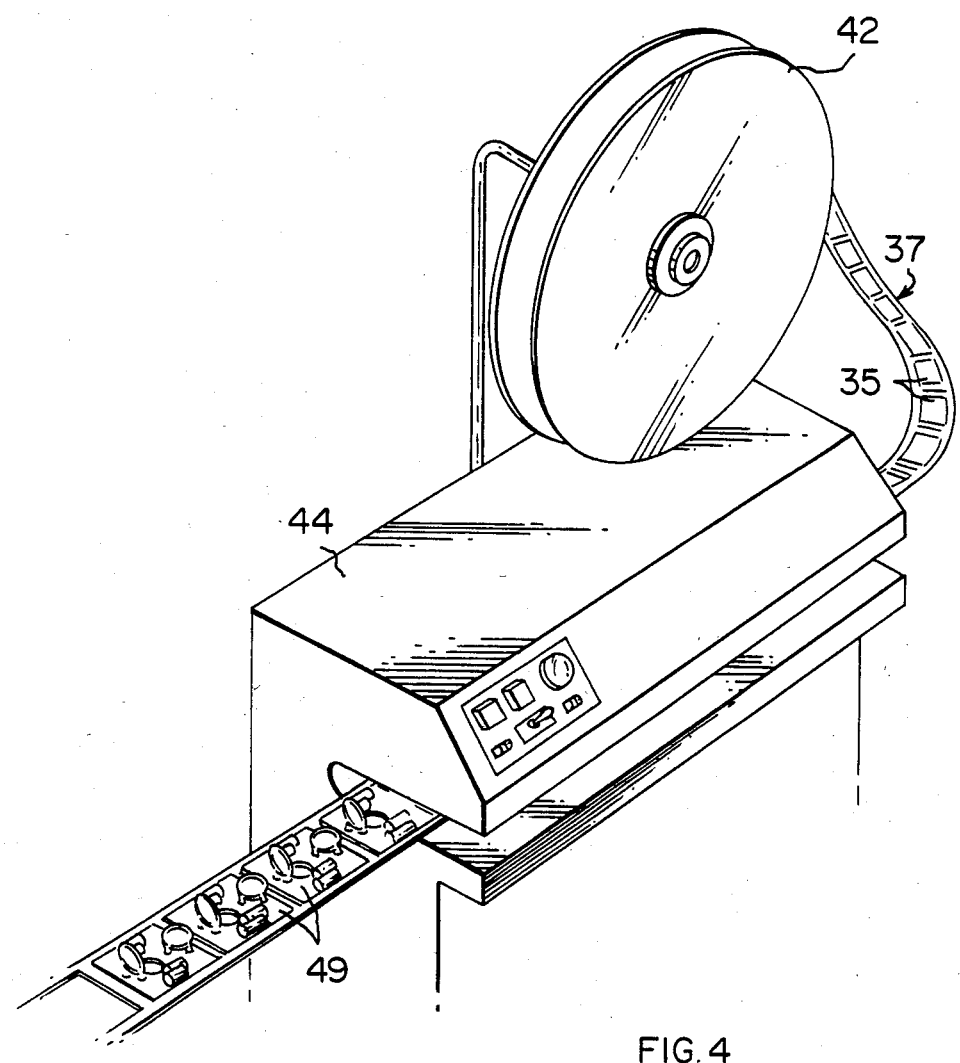
FIG. 4 is a perspective view of a component insertion machine for inserting electronic components into the insulated lead frames of the lead frame assembly forming the electronic packages.

FIG. 1 shows lead frames 10 that are stamped and formed from a suitable strip of metal having the desired spring characteristics such as, for example, brass. Each lead frame 10 includes metal strips 12, 14, 16, 18 and 20 connected to carrier strips 22 and 24 which have a series of holes 26 extending therealong. Metal strips 12 and 14 are also connected to a cross strip 28 extending between carrier strips 22 and 24. Projections 30 extend outwardly from metal strips 12, 14, 16, 18 and 20 at spaced intervals therealong. A bridge member 32 extends between metal strips 16 and 18 and is connected thereto between spring projections 30 of each of these strips to provide support for strips 16, 18.

The lead frames are fed via carrier strips 24 into a conventional mold 22. Each lead frame 10 has molded thereto a housing member 34 of suitable dielectric material forming an insulated lead frame 35, with the ends of metal strips 12, 14, 16, 18 and 20 being exposed and located in recesses 36 of housing member 34. Holes 38 extend through housing member 34 where spring projections 30 are located and as shown in FIG. 3 projections 30 are located in recesses 40 in the bottom of housing member 34 so that projections 30 are movable therein. The free ends of projections 30 extend slightly into the area defined by holes 38 in their normally inoperative positions.

After lead frames 10 have housing members 34 molded thereto forming a lead frame assembly 37 comprising a continuous strip of insulated lead frames 35, this assembly 37 can be fed into a conventional component insertion machine 44 as shown in FIG. 4 or reeled onto a reel member 42. Reel member 42 can then be mounted onto component insertion machine 44 so that lead frame assembly 37 can be fed therethrough via carrier strips 22, 24 so that electronic components in the form of diodes 46 and capacitors 48 can have their leads inserted into respective holes 38. Upon insertion of the leads, spring projections 30 electrically and mechanically engage such leads and are urged downwardly thereby thereby securing the components in position along housing member 34 and form an electrical connection therewith. The edges of projections 30 bite into the electrical leads as the leads are forced against the wall of holes 38 by projections 30. This forms an electronic package 49 and the electronic packages can remain on carrier strips 22 and 24 and re-reeled onto another reel for subsequent use. At the time of use, ends of strips 12,14,16,18 and 20 are severed within recesses 36 to separate electronic packages 49 from carrier and cross strips 22,24 and 28, and the electronic packages are then subjected to testing to make certain that they are functioning properly.

If desired, a U-shaped member 31 can be formed around each of projections 30 as shown in FIG 1A so that the electrical leads can be forced against at least the bottom of members 31 which will be exposed in holes 38.

The particular electronic package shown in FIG. 2 is a full wave rectifier circuit that can be used with DC motors so that AC or DC voltage can be used to drice a DC motor. Thus, electrical conductors 50 are inserted into holes 38 designated by the letter C to connect the full wave rectifier circuit of FIG. 2 and an electric motor circuit to enable it to be used with either AC or DC voltages FIGS. 5 through 7 are directed to an alternative embodiment which includes a switch 132 and insulation displacement terminals for terminating insulated electrical conductors 50 (see FIG. 7) to the package. As shown in FIGS. 5 and 6, lead frame 52 extends between carrier strips 54 and 56 and cross strips 58 and 60 with metal strips 62,64,66,68,70 and 72 being connected to carrier strips 54, 56 and cross strips 58, 60. Projections 74 extend outwardly from metal strips 62,64,66,68,70 and 72 at selected locations therealong and they extend across holes 76 in dielectric housing member 78 molded onto lead frame 52 forming in insulated lead frame. Holes 76 are in communication with recesses (not shown) in the bottom of housing member 78 to enable projections 74 to move therein and to electrically connect with the leads of diodes 80 and capacitors 82 and mechanically secure them therein when they are inserted in position therein. Metal strips 62, 68, 70 and 72 are provided with insulation displacement terminals 84 to terminate insulated electrical power conductors therein. Part of terminals 84 including slots 88 thereof are exposed in recesses 90 of housing member 78.

Metal strips 64, 66 and 70 extend outwardly from housing 78 to a portion of lead frame 52 secured within a second dielectric housing member 92 which portion also has metal strips 72, housing member 92 being molded in position on the metal strips. Metal strips 64, 66 and 72 have contact sections 94,96,98 and 100 exposed in housing member 92 in the form of stationary contact members with contact section 98 defining a common contact member. In switch 132, a movable contact member 102 has a single contact member 104 at one end for electrical contact with contact section 100 and bifurcated contact members 106 and 108 at the other end which electrically engage contact sections 94 and 96 respectively. A center contact member section 110 of each of contact members 106,108 of movable contact member 102 is in electrical engagement with contact section 98 at all times, and lugs 112 extend outwardly from contact members 106 and 108 which are disposed in respective recesses 114 in the sidewalls of larger recess 116 in housing member 92. In larger recess 116 contact sections 94, 96, 98 and 100 are exposed and movable contact member 102 is located. A cover member 118 is latchably secured onto housing member 92 via latching members 120 which extend through holes 121 in housing member 92 and latchably engage the bottom surface of housing member 92 as shown in FIG. 7. An actuating member 122 is slidably mounted in a slot 124 of cover member 118 and includes a coil spring 126 disposed in a bore 128 of actuating member 122 which biases a ball member 130 into engagement with movable contact member 102 to move it from one position in which contact members 106 and 108 are respectively in contact with contact sections 94 and 96 to the other position at which contact member 104 electrically contacts contact section 100. In the first position, the motor operates at a slow speed whereas, in the other position, the motor will operate at a higher speed.

After housing members 78, 92 are molded in position on lead frames 52 and switch 132 added thereon, the continuous strip of insulated lead frames of FIG. 5 can be reeled onto a reel and then fed into a component insertion machine as shown in FIG. 4 or fed directly into the component insertion machine. After the insulated lead frames have been loaded with components, metal strips 62, 64, 66, 68, 70 and 72 are severed in recesses 73 in housing members 78, 92 from carrier and cross-strips 54, 56, 58 and 60 to form electronic packages 134.

The present invention lends itself to continuous strip processing wherein the lead frames are stamped in a progressive die, and lead frames are then subjected to a molding operation on a continuous basis to mold dielectric housing to the lead frame so that the molded assembly comes out of the mold on the same continuous strip. This molded assembly can then be rewound back onto a reel for further processing or shipment to the customer. This permits the customer to feed the molded assembly into their manufacturing system without requiring sorting, unstacking or other orientation. Soldering is eliminated because the components and power conductors are electrically connected in the lead frame via electrical terminals that provide excellent electrical and mechanical terminations. Reduction of the number of components is achieved through incorporating the required mechanical features in the molding operation. This eliminates tooling or purchasing a variety of mechanical parts thereby resulting in cost and labor savings. Reduction in assembly tolerances is achieved because the lead frame is molded into a dielectric housing without requiring additional assembly. Applied cost savings result from the elimination of assembly operations, providing the product on a continuous strip, and eliminating soldering operations.

A lead frame assembly has been disclosed that comprises lead frames as part of carrier strips with dielectric housing members secured to the lead frames, metal strips of the lead frames have spaced projections therealong that extend into holes in the housing members and are movable in recesses in the housing members so that electrical conductors can be inserted into the holes and be mechanically and electrically terminated by the projections.

We claim:
1. A lead frame assembly, comprising:
a continuous strip of lead frames stamped and formed from a strip of metal, each of said lead frames including spaced metal strips extending between carrier strips, and further including projections extending outwardly from said metal strips at spaced locations therealong; and at least first dielectric housing members secured onto said lead frames, each said first housing member having holes therethrough at the locations of free ends of said projections, and further having recesses disposed in a bottom surace thereof in communication with respective said holes, exposing said projections and enabling said projections to be urged downwardly therein, said free ends of said projections extending into said holes and engageable by electrical conductors inserted into respective said holes and deflectable downwardly thereby into respective said recesses, enabling said electrical conductors to be electrically and mechanically terminated in said holes by said free ends of said projections forcing said conductors against opposing wall portions of said holes.

2. A lead frame assembly as set forth in claim 1, wherein some of said metal strips include electrical terminal members having insulation displacement slots therein.

3. A lead frame assembly as set forth in claim 1, wherein each said lead frame includes a portion extending outwardly from said first housing member secured thereon and a second dielectric housing member is secured to said portion of said lead frame, said portion including metal strips having exposed stationary contact members, a movable contact member is associated with said stationary contact members, a cover means is mounted onto said second housing member, and an actuating means is movably mounted in said cover means for moving said movable contact member from one position to another position relative to said stationary contact members.

4. As insulated lead frame, comprising:
   at least a first dielectric housing member;
   metal strips extending through said first housing member and secured therein, said metal strips having projections extending outwardly thereform at spaced intervals therealong;
   said first housing member having holes therethrough at the locations of free ends of said projections, and further having recesses disposed in a bottom surface thereof in communication with respective said holes, exposing said projections and enabling said projections to be urged downwardly therein, said free ends of said projections extending into said holes and engageable by electrical conductors inserted into respective said holes and deflectable downwardly thereby into respective said recesses, enabling said electrical conductors to be electrically and mechanically terminated in said holes by said free ends of said projections forcing said conductors against opposing wall portions of said holes.

5. An insulated lead frame according to claim 4, wherein some of said metal strips include electrical terminal members having insulation displacement slots therein.

6. An insulated lead frame according to claim 4, wherein said projections are disposed in U-shaped sections of said lead frame.

7. An insulated lead frame according to claim 4, wherein said lead frame includes a portion extending outwardly from said first housing member secured therein and a second dielectric housing member is secured to said portion of said lead frame, said portion including metal strips having exposed stationary contact members, a movable contact member is associated with said stationary contact members, a cover means is mounted onto said second housing member, and an actuating means is movably mounted in said cover means for moving said movable contact member from one position to another position relative to said stationary contact members.

* * * * *